(12) United States Patent
Lealman

(10) Patent No.: US 9,570,886 B2
(45) Date of Patent: Feb. 14, 2017

(54) TUNABLE LASER AND METHOD OF TUNING A LASER

(71) Applicant: Huawei Technologies Co., Ltd., Shenzhen, Guangdong (CN)

(72) Inventor: Ian Lealman, Ipswich (GB)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/005,549

(22) Filed: Jan. 25, 2016

(65) Prior Publication Data
US 2016/0218484 A1    Jul. 28, 2016

(30) Foreign Application Priority Data

Jan. 27, 2015  (EP) .................................. 15152631

(51) Int. Cl.
| | |
|---|---|
| H01S 5/10 | (2006.01) |
| H01S 5/06 | (2006.01) |
| H01S 3/1055 | (2006.01) |
| H01S 5/0625 | (2006.01) |
| H01S 5/40 | (2006.01) |

(52) U.S. Cl.
CPC ........... *H01S 5/1014* (2013.01); *H01S 3/1055* (2013.01); *H01S 5/0612* (2013.01); *H01S 5/06256* (2013.01); *H01S 5/1007* (2013.01); *H01S 5/1025* (2013.01); *H01S 5/1032* (2013.01); *H01S 5/4068* (2013.01); *H01S 5/4062* (2013.01)

(58) Field of Classification Search
None
See application file for complete search history.

(56) References Cited

U.S. PATENT DOCUMENTS

| | | |
|---|---|---|
| 2002/0031297 A1 | 3/2002 | Forrest et al. |
| 2003/0007719 A1 | 1/2003 | Forrest et al. |
| 2004/0125833 A1 | 7/2004 | Sarlet et al. |
| 2009/0225796 A1 | 9/2009 | Kato |
| 2010/0142579 A1 | 6/2010 | Leem et al. |

(Continued)

FOREIGN PATENT DOCUMENTS

| | | |
|---|---|---|
| EP | 0634823 A1 | 1/1995 |
| EP | 1 058 358 A1 | 12/2000 |

(Continued)

OTHER PUBLICATIONS

P.V. Studenkov et al., "Asymmetric Twin-Waveguide 1.55-μm Wavelength Laser with a Distributed Bragg Reflector", IEEE Photonics Technology Letters, vol. 12, No. 5, May 2000, p. 468-470.

(Continued)

*Primary Examiner* — Armando Rodriguez

(57) ABSTRACT

The invention relates to a tunable laser, the tunable laser comprising a first waveguide, a second waveguide and a semiconductor layer being arranged to separate the first waveguide from the second waveguide. The first waveguide comprises a first coupling portion and an active portion for generating a laser signal. The second waveguide comprises a second coupling portion and a tuning portion for tuning the wavelength of the laser signal. The first coupling portion and the second coupling portion are configured to couple the laser signal between the first waveguide and the second waveguide through the semiconductor layer.

17 Claims, 7 Drawing Sheets

(56) References Cited

U.S. PATENT DOCUMENTS

| | | | |
|---|---|---|---|
| 2012/0189025 A1* | 7/2012 | Zheng | H01S 5/1071 372/20 |
| 2012/0321244 A1 | 12/2012 | Suzuki et al. | |
| 2014/0133817 A1 | 5/2014 | Lealman et al. | |

FOREIGN PATENT DOCUMENTS

| | | |
|---|---|---|
| EP | 2 544 319 A1 | 1/2013 |
| GB | 2492996 A | 1/2013 |
| JP | 58-114476 A | 7/1983 |
| JP | 07-58418 A | 3/1995 |
| JP | 2001-7439 A | 1/2001 |
| JP | 2009-244868 A | 10/2009 |
| JP | 2013-4688 A | 1/2013 |
| JP | 2013-507792 A | 3/2013 |
| JP | 2013-165288 A | 8/2013 |
| WO | WO 2011/046898 A1 | 4/2011 |

OTHER PUBLICATIONS

L. Xu et al., "Monolithic Integration of an InGaAsP—InP MQW Laser/Waveguide Using a Twin-Guide Structure with a Mode Selection Layer", IEEE Photonics Technology Letters, vol. 9, No. 5, May 1997, p. 569-571.

Hiroyuki Ishii et al., "Narrow Spectral Linewidth Under Wavelength Tuning in Thermally Tunable Super-Structure-Grating (SSG) DBR Lasers", IEEE Journal of Selected Topis in Quantum Electronics, vol. 1, No. 2, Jun. 1995, p. 401-407.

* cited by examiner

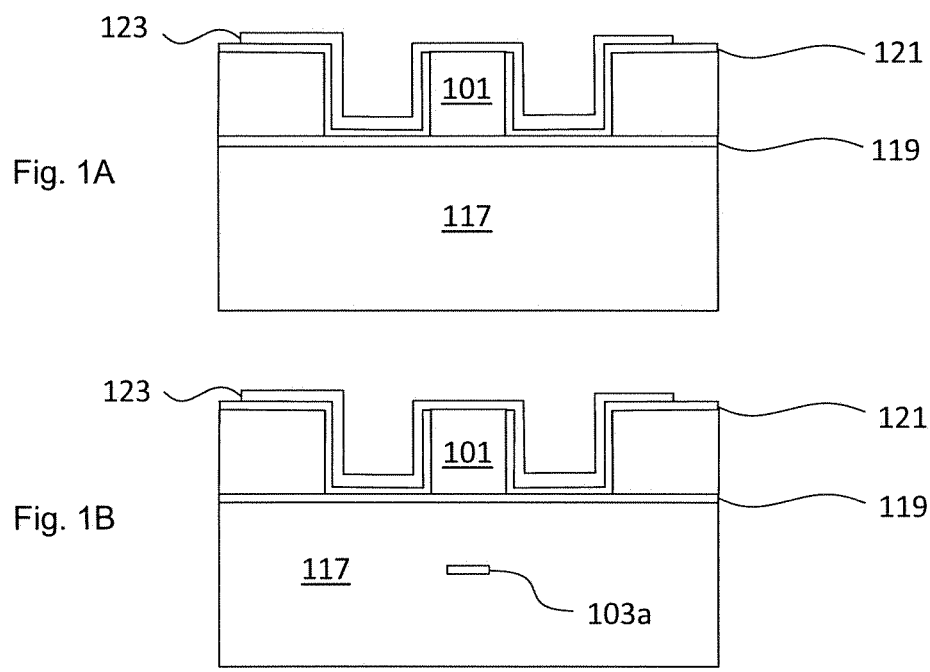

TUNABLE LASER AND METHOD OF TUNING A LASER

CROSS-REFERENCE TO RELATED APPLICATION

This application claims priority to European Patent Application No. EP15152631.6, filed on Jan. 27, 2015, which is hereby incorporated by reference in its entirety.

TECHNICAL FIELD

The present invention relates to a tunable laser and a method of tuning a laser.

BACKGROUND

Tunable lasers have been of interest for some time. Applications range from broadband sensors to sources for fiber optic communications networks. In a fiber optic communications network the amount of information carried on a single optical fiber may be increased by multiplexing different optical signals on different wavelengths using wavelength division multiplexing (WDM). In a WDM-PON (passive optical network), for example, a single trunk fiber carries optical signals at multiple channel wavelengths to and from an optical branching point and the branching point provides a simple routing function by directing signals of different wavelengths to and from individual subscribers. At each subscriber location, an optical networking terminal is assigned one or more of the channel wavelengths for sending and/or receiving optical signals. Obviously, a larger tuning range of a tunable laser corresponds to a larger number of possible channel wavelengths and, thus, to a larger amount of information that may be transmitted over a single optical fiber. There is, therefore, a need for widely tunable lasers, i.e. lasers having a large wavelength tuning range.

SUMMARY

It is an object of the invention to provide a widely tunable laser.

This object is achieved by the subject matter of the independent claims. Further implementation forms are provided in the dependent claims, the description and the figures.

According to a first aspect, the invention relates to a tunable laser comprising a first waveguide, a second waveguide and a semiconductor layer being arranged to separate the first waveguide from the second waveguide. The first waveguide comprises a first coupling portion and an active portion for generating a laser signal. The second waveguide comprises a second coupling portion and a tuning portion for tuning the wavelength of the laser signal. The first coupling portion and the second coupling portion are configured to couple the laser signal between the first waveguide and the second waveguide through the semiconductor layer. Thus, a widely tunable laser is provided.

In such a tunable laser the physical separation between the active portion or active region and the tuning portion or tuning region due to the physical separation between the first active waveguide and the second passive waveguide reduces any negative effects that tuning, such as tuning by heat, current, voltage, stress and the like, can have on the operation of the active portion of the first waveguide.

In a first possible implementation form of the tunable laser according to the first aspect, at least one of the first waveguide or the second waveguide is embedded within the semiconductor layer.

In such a tunable laser the physical separation between the first waveguide and the second waveguide is provided by burying the first waveguide and/or the second waveguide in the layer of semiconductor material.

In a second possible implementation form of the tunable laser according to the first aspect as such or the first possible implementation form of the first aspect, the tunable laser further comprises at least one heating element for heating the tuning portion in order to thermally tune the wavelength of the laser signal.

For thermal tuning the physical separation between the active portion of the first waveguide and the tuning portion of the second waveguide is of particular advantage, as the thermal tuning can be performed in an un-doped or low n-doped material of the tuning portion of the second waveguide reducing optical loss without compromising current injection in the active portion of the first waveguide.

In a third possible implementation form of the tunable laser according to the first aspect as such or the first or the second possible implementation form of the first aspect, the first coupling portion and the second coupling portion are arranged in parallel.

A parallel orientation of the first coupling portion of the first active waveguide and the second coupling portion of the second passive waveguide provides for an efficient optical coupling between the first coupling portion and the second coupling portion.

In a fourth possible implementation form of the tunable laser according to the first aspect as such or the first to the third possible implementation form of the first aspect, the first coupling portion at least partially overlies the second coupling portion.

An overlapping arrangement of the first coupling portion of the first active waveguide to the second coupling of the second passive waveguide provides for an efficient optical coupling between the first coupling portion and the second coupling portion.

In a fifth possible implementation form of the tunable laser according to the first aspect as such or the first to the fourth possible implementation form of the first aspect, the first coupling portion and/or the second coupling portion comprises a tapered width portion.

The first coupling portion and/or the second coupling portion having a tapered width portion provides for an efficient optical coupling between the first coupling portion of the first active waveguide and the second coupling portion of the second passive waveguide.

In a sixth possible implementation form of the tunable laser according to the first aspect as such or the first to the fifth possible implementation form of the first aspect, the first waveguide is a ridge waveguide.

A tunable laser with a first active waveguide in form of a ridge waveguide has advantageous optical properties and is easy to manufacture.

In a seventh possible implementation form of the tunable laser according to the first aspect as such or the first to the sixth possible implementation form of the first aspect, the tunable laser comprises a first semiconductor layer forming the first waveguide and a second semiconductor layer forming the second waveguide, wherein the semiconductor layer separating the first waveguide from the second waveguide is a semiconductor substrate layer supporting the first semiconductor layer and the second semiconductor layer.

Such a tunable semiconductor laser is easy to manufacture.

In an eighth possible implementation form of the tunable laser according to the first aspect as such or the first to the seventh possible implementation form of the first aspect, the second waveguide has a Y-shaped form comprising a first arm and a second arm, wherein the second coupling portion forms at least a part of the basis of the Y-shaped second waveguide and the first arm and the second arm form the respective arms of the Y-shaped second waveguide.

Such a configuration of the second passive waveguide allows the tunable laser to be configured as an MG-Y type laser (modulated grating Y laser). The second coupling portion can be connected by an optical splitter, such as a 1×2 MMI unit, to the first and the second arm of the second waveguide.

In a ninth possible implementation form of the tunable laser according to the eighth possible implementation form of the first aspect, the first arm comprises a first wavelength selective element and the second arm comprises a second wavelength selective element, wherein the first wavelength selective element is configured to provide a first reflected laser signal having a comb-shaped spectrum and wherein the second wavelength selective element is configured to provide a second reflected laser signal having a comb-shaped spectrum, wherein the spacing between subsequent peaks of the comb-shaped spectrum of the first reflected laser signal differs from the spacing between subsequent peaks of the comb-shaped spectrum of the second reflected laser signal.

This implementation form allows for tuning of the laser signal by means of the Vernier effect, i.e. the constructive interference of the first reflected laser signal having a comb-shaped spectrum with the second reflected laser signal having a comb-shaped spectrum at a specific tunable wavelength.

In a tenth possible implementation form of the tunable laser according to the ninth possible implementation form of the first aspect, the first wavelength selective element or the second wavelength selective element is formed as a sampled grating distributed Bragg reflector or a superstructure grating distributed Bragg reflector.

For a tunable semiconductor laser a sampled grating distributed Bragg reflector (DBR) or a superstructure grating DBR is easy to manufacture.

In an eleventh possible implementation form of the tunable laser according to the ninth possible implementation form of the first aspect, the first wavelength selective element is formed by a portion of varying width of the first arm or the second wavelength selective element is formed by a portion of varying width of the second arm.

For a tunable semiconductor laser this implementation of the first and/or the second wavelength selective element allows for providing the first and/or the second wavelength selective element and the second waveguide on the same semiconductor layer, which, in turn, allows the tunable semiconductor laser to be fabricated using less stages of epitaxy.

In a twelfth possible implementation form of the tunable laser according to the ninth to eleventh possible implementation form of the first aspect, the second waveguide further comprises a phase adjuster for aligning a first phase of the first reflected laser signal with a second phase of the second reflected laser signal.

For a tunable laser implemented as a MG-Y type laser a phase adjuster allows to add the first reflected laser signal and the second reflected laser signal in phase. The phase adjuster can comprise at least one heating element for heating a portion of the first arm or the second arm of the second waveguide.

In a thirteenth possible implementation form of the tunable laser according to the eighth to twelfth possible implementation form of the first aspect, the tunable laser further comprises a thermal insulation trench provided in the semiconductor layer separating the first waveguide from the second waveguide for providing thermal insulation between the first arm and the second arm of the second waveguide.

For a tunable laser implemented as a MG-Y type laser a thermal insulation trench allows minimizing the thermal crosstalk between the first and the second arm of the second waveguide and, thus, provides for a higher quality laser signal.

According to a second aspect, the invention relates to a method of tuning a laser, the method comprising the steps of: generating a laser signal by an active region of a first waveguide; guiding the laser signal by the first waveguide to a first coupling portion of the first waveguide; optically coupling the laser signal from the first coupling portion of the first waveguide into a second coupling portion of a second waveguide, wherein the first waveguide is separated from the second waveguide by a semiconductor layer; guiding the laser signal by the second waveguide to a tuning portion of the second waveguide; and tuning the wavelength of the laser signal by the tuning portion of the second waveguide.

The method can be performed by the tunable laser according to the first aspect. Further features of the method according to the second aspect directly result from the configuration and the functionality of the tunable laser according to the first aspect.

BRIEF DESCRIPTION OF THE DRAWINGS

Further embodiments of the invention will be described with respect to the following figures, in which:

FIGS. 1A to 1E show schematic cross-sections along the lines A, B, C, D and E shown in FIG. 1;

DETAILED DESCRIPTION

Figure 1:
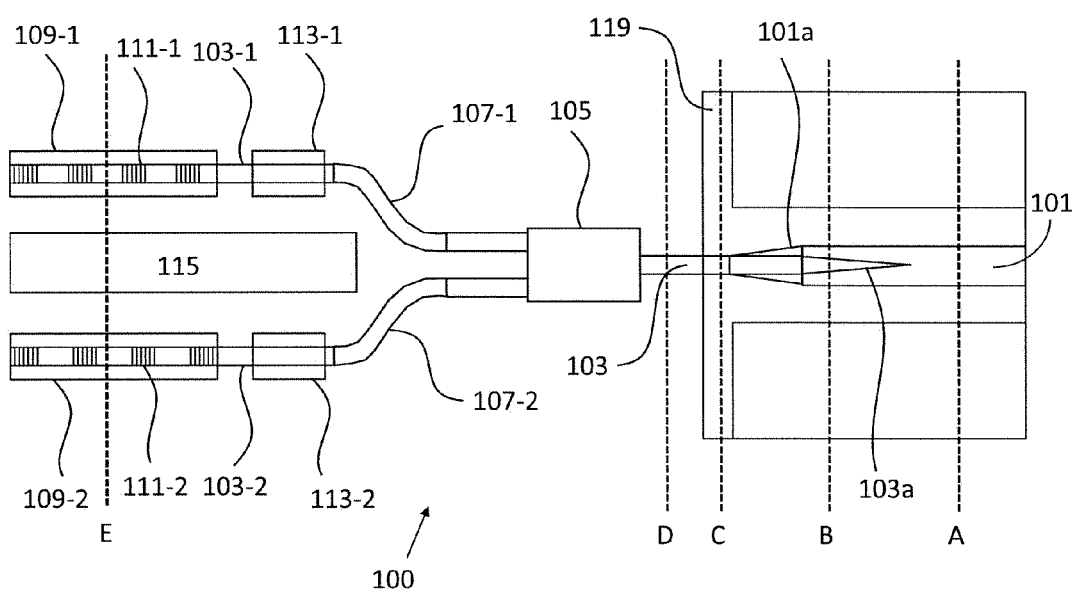
FIG. 1 shows a schematic top plan view of a tunable laser according to an embodiment.
Figure 1C:
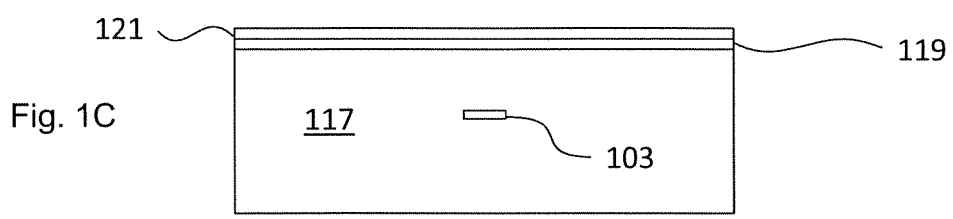
Figure 1D:
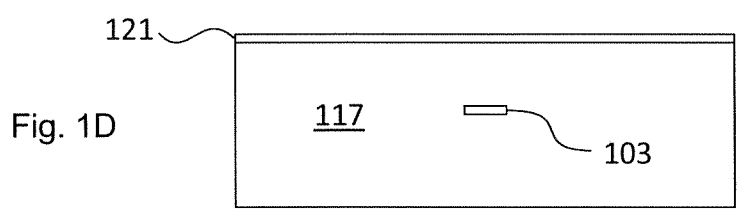

In the following detailed description, reference is made to the accompanying drawings, which form a part of the disclosure, and in which are shown, by way of illustration, specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The devices and methods described herein may be based on tunable lasers and methods of tuning a laser. A tunable laser is a laser whose wavelength of operation can be altered in a controlled manner. While all laser gain media allow small shifts in output wavelength, only a few types of lasers allow continuous tuning over a significant wavelength range. For instance, a widely tunable laser can allow continuous tuning over a substantial portion of the C-Band. Optical fiber communications typically operate in a wavelength region corresponding to different "telecom windows". The C Band describes one such window that is widely used and utilizes wavelengths around 1.5 µm (1530-1565 nm). The losses of silica fibers are lowest in this region, and erbium-doped fiber amplifiers and laser diodes are available which offer very high performance.

The devices and methods described herein may be implemented for producing integrated optical chips. The described devices and systems may include integrated circuits and may be manufactured according to various technologies. For example, the circuits may include logic integrated circuits, analog integrated circuits, mixed signal integrated circuits, optical circuits and/or memory circuits.

In the following description devices and methods using optical waveguides are described. An optical waveguide is a physical structure that guides electromagnetic waves in the optical spectrum. Common types of optical waveguides include optical fiber and rectangular waveguides. Optical waveguides can be classified according to their geometry, e.g., as planar, strip, or fiber waveguides, mode structure, e.g., as single-mode or multi-mode, refractive index distribution, e.g., step or gradient index distribution and material, e.g., glass, polymer or semiconductor.

In the following detailed description devices and methods using gratings and sampled or structured gratings are described. Sampled or structured gratings can be described as structures in a waveguide system, having a periodically broken short-period structure including short period stripped regions alternating with non-stripped regions. The supergratings can be described as structures in a waveguide system having a diffractive grating having a plurality of repeating unit regions each having a constant length, thus forming a modulation period, and at least one parameter that determines the optical reflectivity or transmission of the diffractive grating varying depending on its position in each of the repeating unit regions along a direction of optical transmission in the laser, the diffractive grating extending by at least two modulation periods.

FIG. 1 shows a schematic top plan view of a tunable laser 100 according to an embodiment. FIGS. 1A to 1E show respective schematic cross-sections along the lines A, B, C, D and E shown in FIG. 1. In an embodiment, the tunable laser 100 is implemented as a monolithic semiconductor laser.

The tunable laser 100 comprises a first active waveguide 101 and a second passive waveguide 103. The first waveguide 101 is arranged on top of an active layer 19. In an embodiment, the first waveguide 101 can be implemented in form of a ridge waveguide on top of the active layer 119. The active layer 119, in turn, is arranged on top of a semiconductor substrate layer 117. The second waveguide 103 is embedded within the semiconductor substrate layer 117 and, thus, physically separated from the first waveguide 101.

The active layer 119 lying underneath the first waveguide 101 defines an active portion of the first waveguide 101. The active portion provides the optical gain necessary for generating a laser signal. The active layer 119 can be implemented as a multiple quantum well (MQW) structure.

In an embodiment, the active layer 119 is implemented as a MQW structure comprising indium gallium aluminum arsenide layers. In a further embodiment, the active layer 119 is implemented as a MQW structure comprising indium gallium arsenide phosphide layers.

In an embodiment, the semiconductor substrate layer 117 is an n-doped indium phosphide substrate layer. In an embodiment, the first waveguide 101 comprises p-doped indium phosphide material. In an embodiment, the second waveguide 103 comprises indium gallium arsenide phosphide material with a band gap of shorter wavelength than the active layer 119.

In an embodiment, a passivation layer 121 is arranged partially on top of the active layer 119 and partially on top of the semiconductor substrate layer 117. In an embodiment, the passivation layer 121 comprises silicon dioxide, i.e. silica, or silicon nitride.

In an embodiment, a p-side contact metal layer 123 is arranged partially on top of the passivation layer 121 and partially on top of the first waveguide 101. In an embodiment, the p-side contact metal layer 123 comprises titanium, platinum and/or gold.

The first waveguide 101 comprises a first coupling portion 101a. The first coupling portion 101a of the first waveguide 101 overlies a second coupling portion 103a of the second waveguide 103 embedded within the semiconductor substrate layer 117. The first coupling portion 101a of the first active waveguide 101 and the second coupling portion 103a of the second passive waveguide 103 are positioned such that optical radiation in form of a laser signal couples from the first coupling portion 101a to the second coupling portion 103a through the semiconductor substrate layer 117 and vice versa. In an embodiment, the first coupling portion 101a and the second coupling portion 103a can be arranged substantially parallel. In an embodiment, the first coupling portion 101a and/or the second coupling portion 103a can have a tapered width section, i.e. a section with constant height and tapered width, providing for a very efficient mode transfer from the first waveguide 101 to the second waveguide 103 and vice versa.

Generally, the second waveguide 103 has a Y-shaped form comprising a first arm 103-1 and a second arm 103-2. The second coupling portion 103a forms a part of the basis of the Y-shaped second waveguide 103 and the first arm 103-1 and the second arm 103-2 form the respective branches of the Y-shaped second waveguide 103.

Radiation produced by the active layer 119 in the active portion of the first waveguide 101 can couple into the second waveguide 103 via the first coupling portion 101a of the first waveguide 101 and the second coupling portion 103a of the second waveguide 103. The radiation is guided along the second waveguide 103 and split into two beams by means of an optical splitter 105. In an embodiment, the optical splitter 105 can be implemented in form of a 1×2 MMI optical coupler.

From the optical splitter 105 the optical radiation is guided as a first beam along the first arm 103-1 of the second optical waveguide 103 and as a second beam along the second arm 103-2 of the second optical waveguide 103. To minimize thermal crosstalk between the first arm 103-1 and the second arm 103-2 of the second waveguide 103, the first and second arm 103-1, 103-2 can be spaced as widely as possible. To this end the first arm 103-1 can comprise a first waveguide bend 107-1 and the second arm 103-2 can comprise a second waveguide bend 107-2. Moreover, in the region between the first arm 103-1 and the second arm 103-2 the tunable laser 100 can comprise a thermal insulation trench 115 for thermally insulating the first arm 103-1 from the second arm 103-2. In an embodiment, the thermal insulation trench 115 can be provided in form of a recess etched into the semiconductor substrate layer 117.

At the respective ends of the first arm 103-1 and the second arm 103-2 of the second waveguide 103 a first wavelength selective element 111-1 and a second wavelength selective element 111-2 are provided. The first wavelength selective element 111-1 is configured to provide in response to radiation being guided along the first arm 103-1 of the second waveguide 103 a first reflected laser signal, i.e. reflected radiation, having a comb-shaped spectrum. Likewise, the second wavelength selective element 111-2 is configured to provide in response to radiation being guided along the second arm 103-2 of the second waveguide 103 a second reflected laser signal, i.e. reflected radiation, having a comb-shaped spectrum.

In an embodiment, the first wavelength selective element 111-1 or the second wavelength selective element 111-2 can be implemented as a sampled grating distributed Bragg reflector (DBR) or a superstructure grating distributed Bragg reflector (DBR). In an embodiment, the first wavelength selective element 111-1 is formed by a portion of varying width of the first arm 103-1 of the second waveguide 103 or the second wavelength selective element 111-2 is formed by a portion of varying width of the second arm 103-1 of the second waveguide 103.

The first and second wavelength selective element 111-1 and 111-2 are configured such that the spacing between subsequent peaks of the comb-shaped spectrum of the first reflected laser signal differs from the spacing between subsequent peaks of the comb-shaped spectrum of the second reflected laser signal. Due to this different spacing of the peaks in the comb-shaped spectrum of the first reflected laser signal and the comb-shaped spectrum of the second reflected laser signal, the first reflected laser signal and the second reflected laser signal will constructively interfere at a specific dominant wavelength. The laser signal emitted by the laser 100 will predominantly have this specific wavelength.

Figure 1E:
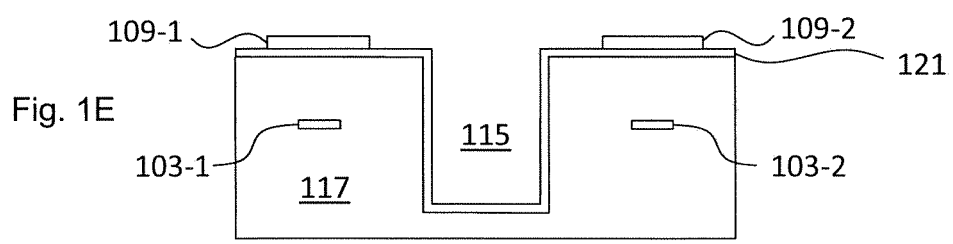

In an embodiment, the tuning portion of the second waveguide 103 is implemented in form of two heating elements 109-1 and 109-2. The heating elements 109-1 and 109-2 are configured and arranged to independently heat the first wavelength selective element 111-1 and the second wavelength selective element 111-2, respectively. In an embodiment, the heating elements 109-1 and 109-2 can be implemented in form of rectangular thin film heaters on top of the semiconductor substrate layer 117, e.g. with the passivation layer 121 arranged between the heaters and the semiconductor substrate layer 117, as shown in FIG. 1E, such that the heaters overlie the first wavelength selective element 111-1 and the second wavelength selective element 111-2 that are embedded within the semiconductor substrate layer 117.

Heating the first wavelength selective element 111-1 and/or the second wavelength selective element 111-2 by means of the heating elements 109-1 and/or 109-2 has the effect that the respective comb-shaped reflection spectra will be modified. Depending on the form in which the wavelength selective elements 111-1 and 111-2 are implemented a change in temperature caused by the heating element 109-1 and/or the heating element 109-2 usually leads to a constant wavelength shift of the comb-shaped spectrum of the first reflected laser signal and/or the second reflected laser signal. This is mainly because the refractive index of the material of which that wavelength selective element is made usually depends on temperature.

A constant wavelength shift of the comb-shaped spectrum of the first reflected laser signal and/or the comb-shaped spectrum of the second reflected laser signal generally will have the effect that the first reflected laser signal and the second reflected laser signal constructively interfere at a different dominant wavelength. Thus, by heating the wavelength selective element 111-1 and/or the wavelength selective element 111-2 the dominant wavelength of the laser signal produced by the laser 100 can be tuned. Heating only one of the wavelength selective elements, for instance, the wavelength selective element 111-1, while keeping the comb-shaped spectrum of the reflected laser signal generated by the other wavelength selective element, for instance, the wavelength selective element 111-2, fixed, allows for a discontinuous tuning of the dominant wavelength of the resulting laser signal. For such an application, it would be sufficient to provide a heating element only for one of the wavelength selective elements 111-1 and 111-2. With the two independently controllable heating elements 111-1 and 111-2 shown in FIG. 1 it is possible to independently heat the wavelength selective elements 111-1 and 111-2 and to tune the dominant wavelength of the final laser signal continuously. Thus, the wavelength selective elements 111-1 and 111-2 define a tuning portion of the second waveguide 103.

In an embodiment, the wavelength selective elements 111-1 and 111-2 are configured to generate a constant wavelength shift of the comb-spectra of the reflected laser signals by means other than by thermal tuning. For instance, in an embodiment, the wavelength selective elements 111-1 and 111-2 can be configured that their refractive index is modified due to current injection, voltage or stress.

In an embodiment, the second waveguide 103 comprises a phase adjuster configured to offset a phase difference between the first reflected laser signal and the second reflected laser signal. The phase adjuster can be implemented in form of two independently controllable heating elements 113-1 and 113-2 overlying a portion of the first arm 103-1 and a portion of the second arm 103-2 of the second waveguide 103, respectively.

Figure 2:
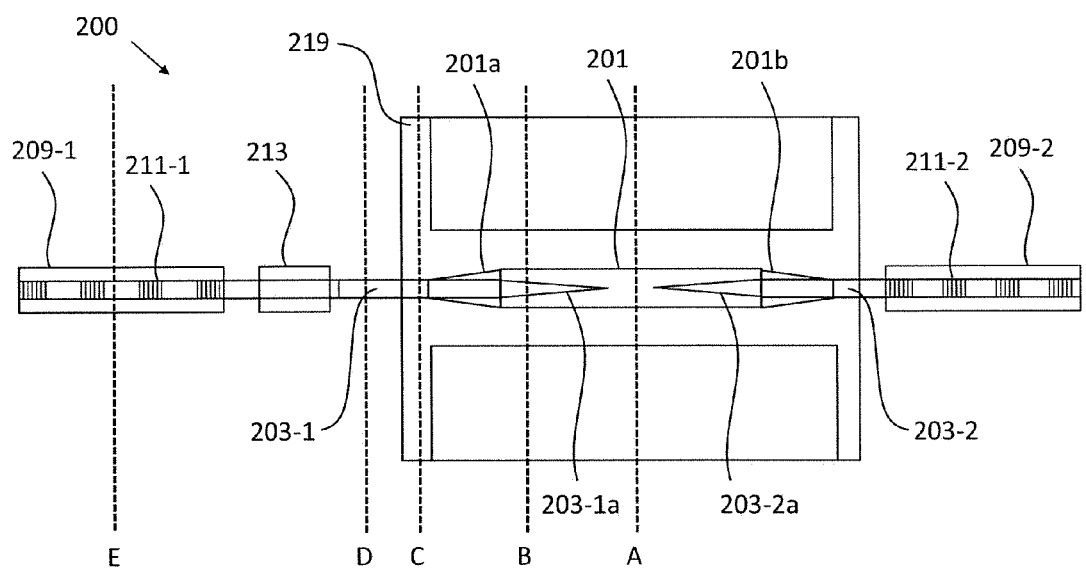
FIG. 2 shows a schematic top plan view of a tunable laser according to an embodiment.
Figure 2A:
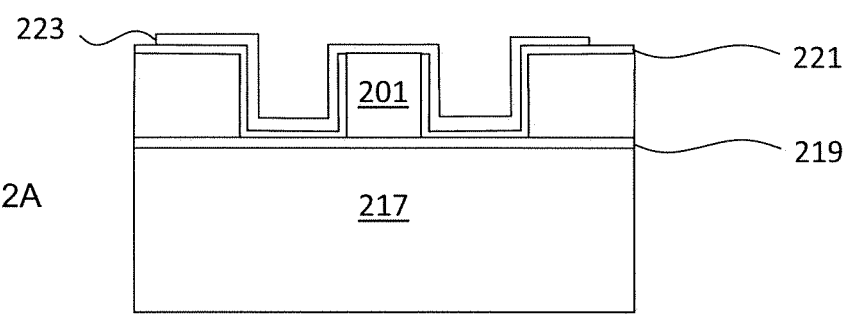
FIGS. 2A to 2E show schematic cross-sections along the lines A, B, C, D and E shown in FIG. 2.
Figure 2B:
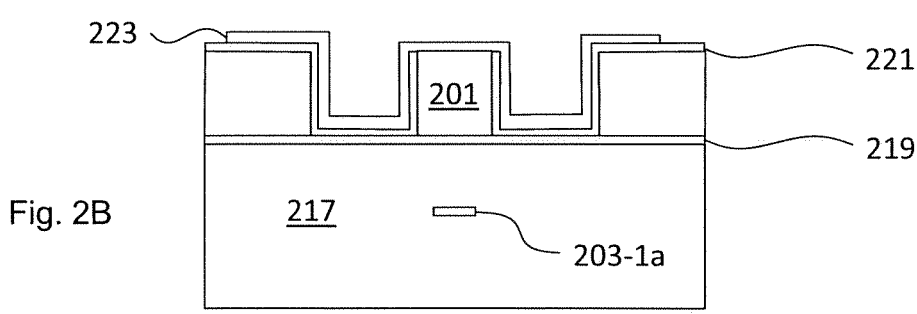
Figure 2C:
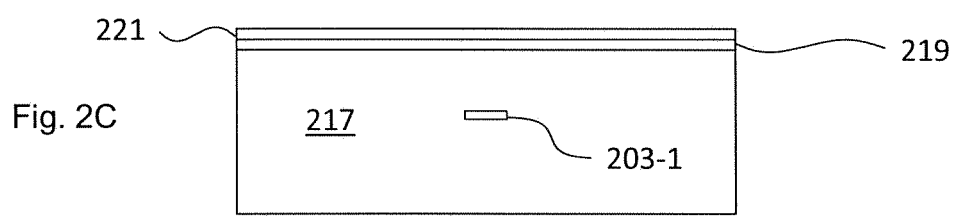
Figure 2D:
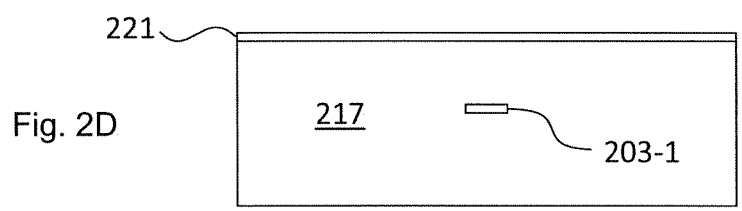
Figure 2E:
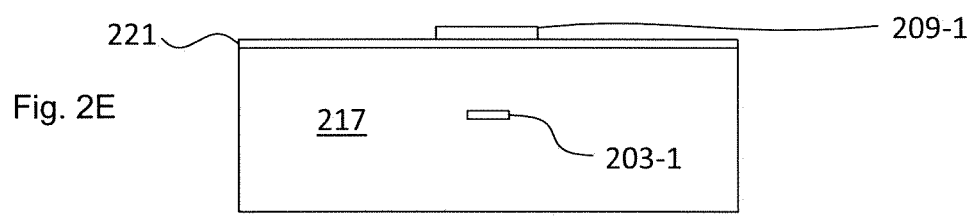

FIG. 2 shows a schematic top plan view of a tunable laser 200 according to an embodiment. FIGS. 2A to 2E show respective schematic cross-sections along the lines A, B, C, D and E shown in FIG. 2. In an embodiment, the tunable laser 200 is implemented as a monolithic semiconductor laser.

In order to avoid unnecessary repetitions the below description of the embodiment of FIG. 2 and FIGS. 2A to 2E will focus on the differences to the embodiment of FIG. 1 and FIGS. 1A to 1E. The same elements shown in FIG. 2 and FIGS. 2A to 2E and FIG. 1 and FIGS. 1A to 1E have been identified by the same reference signs. For a detailed discussion of these same elements reference is made to the above description. For example, the following elements of the laser 200 are identical to the corresponding elements of the laser 100: the active layers 119 and 219, the phase adjuster heating elements 113-1, 113-2 and 213, the passivation layers 121 and 221 and the p-side contact metal layers 123 and 223.

Generally, the embodiment of the tunable laser 200 shown in FIG. 2 and FIGS. 2A to 2E is a sampled grating or superstructure grating DBR laser. The main difference to the embodiment of the tunable laser 100 in form of a MG-Y type laser shown in FIG. 1 and FIGS. 1A to 1E is the configuration of the second passive waveguide.

Whereas in the tunable laser 100 the second passive waveguide 103 is Y-shaped with a first arm 103-1 and a second arm 103-2, the second passive waveguide of the tunable laser 200 is made up of two portions 203-1 and 203-2 extending to different sides of the first active waveguide 201. To this end, the first waveguide 201 has two coupling portions 201a and 201b. The two coupling portions 201a and 201b of the first waveguide 201 can each comprise a tapered width portion. Each of the two coupling portions 201a and 201b of the first waveguide 201 is configured to couple a laser signal generated within the active portion of the first waveguide 201 through the semiconductor layer 217 into a respective coupling portion 203-1a and 203-2a of a first portion 203-1 and a second portion 203-2 of the second waveguide. The coupling portion 203-1a of the first portion 203-1 of the second waveguide and the coupling portion 203-2a of the second portion 203-2 of the second waveguide can have a tapered width portion.

As the functionality of the wavelength selective elements 211-1, 221-2 and the heater elements 209-1, 209-2 is identical to the functionality of the wavelength selective elements 111-1, 111-2 and the heater elements 109-1, 109-2, reference is made to the above description of how these elements are configured and how these elements allow for tuning the wavelength of the laser signal generated by the laser 200.

Figure 3:
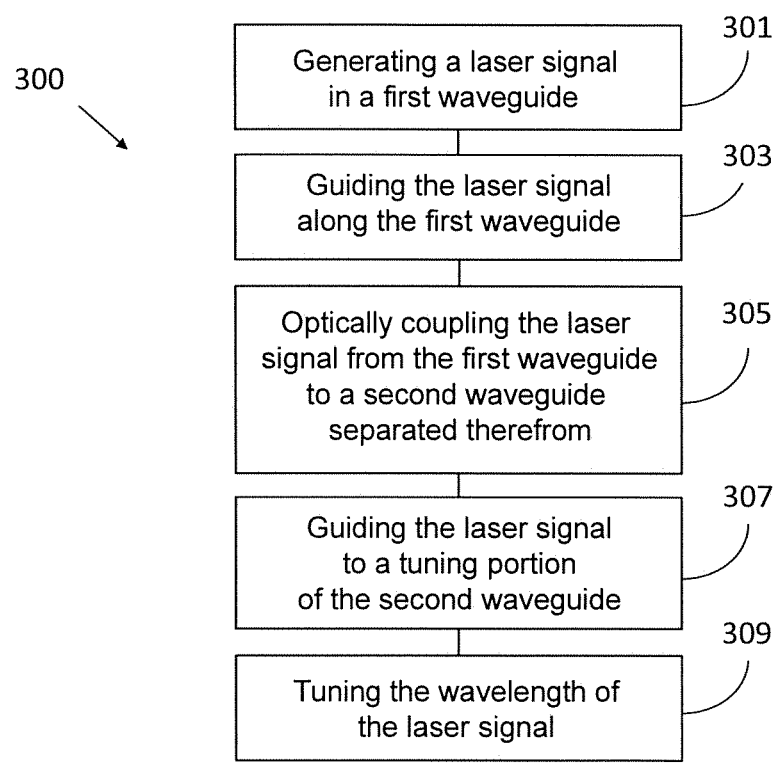
FIG. 3 shows a schematic diagram of a method of tuning a laser according to an embodiment.

FIG. 3 shows a schematic diagram of a method 300 of tuning a laser according to an embodiment. In a first step 301 of the method 300 a laser signal is generated by an active region of a first waveguide. In a second step 303 of the method 300 the laser signal is guided by the first waveguide to a first coupling portion of the first waveguide. In a third step 305 of the method 300 the laser signal is optically coupled from the first coupling portion of the first waveguide into a second coupling portion of a second waveguide, wherein the first waveguide is separated from the second waveguide by a semiconductor layer. In a fourth step 307 of the method 300 the laser signal is guided by the second waveguide to a tuning portion of the second waveguide. In a fifth step 309 of the method 300 the wavelength of the laser signal is tuned by the tuning portion of the second waveguide.

The methods, systems and devices described herein may be implemented as optical circuit within a chip or an integrated circuit or an application specific integrated circuit (ASIC). The invention can be implemented in digital and/or analogue electronic and optical circuitry.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A tunable laser, comprising:
   a first waveguide comprising a first coupling portion and an active portion for generating a laser signal;
   a second waveguide comprising a second coupling portion and a tuning portion for tuning the wavelength of the laser signal;
   a semiconductor layer being arranged to separate the first waveguide from the second waveguide;
   wherein the first coupling portion and the second coupling portion are configured to couple the laser signal between the first waveguide and the second waveguide through the semiconductor layer;
   wherein the first coupling portion at least partially overlies the second coupling portion.

2. The tunable laser of claim 1, wherein at least one of the first waveguide or the second waveguide is embedded within the semiconductor layer.

3. The tunable laser of claim 1, further comprising a heating element for heating the tuning portion in order to thermally tune the wavelength of the laser signal.

4. The tunable laser of claim 1, wherein the first coupling portion and the second coupling portion are arranged in parallel.

5. A tunable laser, comprising:
   a first waveguide comprising a first coupling portion and an active portion for generating a laser signal;
   a second waveguide comprising a second coupling portion and a tuning portion for tuning the wavelength of the laser signal;
   a semiconductor layer being arranged to separate the first waveguide from the second waveguide;
   wherein the first coupling portion and the second coupling portion are configured to couple the laser signal between the first waveguide and the second waveguide through the semiconductor layer;
   wherein the first coupling portion or the second coupling portion comprises a tapered width portion.

6. The tunable laser of claim 1, wherein the first waveguide is a ridge waveguide.

7. A tunable laser, comprising:
a first waveguide comprising a first coupling portion and an active portion for generating a laser signal;
a second waveguide comprising a second coupling portion and a tuning portion for tuning the wavelength of the laser signal;
a semiconductor layer being arranged to separate the first waveguide from the second waveguide;
wherein the first coupling portion and the second coupling portion are configured to couple the laser signal between the first waveguide and the second waveguide through the semiconductor layer;
a first semiconductor layer forming the first waveguide;
a second semiconductor layer forming the second waveguide; and
wherein the semiconductor layer separating the first waveguide from the second waveguide is a semiconductor substrate layer supporting the first semiconductor layer and the second semiconductor layer.

8. A tunable laser, comprising:
a first waveguide comprising a first coupling portion and an active portion for generating a laser signal;
a second waveguide comprising a second coupling portion and a tuning portion for tuning the wavelength of the laser signal;
a semiconductor layer being arranged to separate the first waveguide from the second waveguide;
wherein the first coupling portion and the second coupling portion are configured to couple the laser signal between the first waveguide and the second waveguide through the semiconductor layer;
wherein:
the second waveguide has a Y-shaped form comprising a first arm and a second arm; and
wherein the second coupling portion forms at least part of the basis of the Y-shaped second waveguide and the first arm and the second arm form the respective arms of the Y-shaped second waveguide.

9. The tunable laser of claim 8, wherein:
the first arm comprises a first wavelength selective element and the second arm comprises a second wavelength selective element;
wherein the first wavelength selective element is configured to provide a first reflected laser signal having a comb-shaped spectrum;
wherein the second wavelength selective element is configured to provide a second reflected laser signal having a comb-shaped spectrum; and
wherein the spacing between subsequent peaks of the comb-shaped spectrum of the first reflected laser signal differs from the spacing between subsequent peaks of the comb-shaped spectrum of the second reflected laser signal.

10. The tunable laser of claim 9, wherein the first wavelength selective element or the second wavelength selective element is formed as a sampled grating distributed Bragg reflector or a superstructure grating distributed Bragg reflector.

11. The tunable laser of claim 9, wherein the first wavelength selective element is formed by a portion of varying width of the first arm of the second waveguide or the second wavelength selective element is formed by a portion of varying width of the second arm of the second waveguide.

12. The tunable laser of claim 9, wherein the second waveguide further comprises a phase adjuster for aligning a first phase of the first reflected laser signal with a second phase of the second reflected laser signal.

13. The tunable laser of claim 8, further comprising:
a thermal insulation trench provided in the semiconductor layer separating the first waveguide from the second waveguide for providing thermal insulation between the first arm and the second arm of the second waveguide.

14. A method of tuning a laser, the method comprising:
generating a laser signal by an active region of a first waveguide;
guiding the laser signal by the first waveguide to a first coupling portion of the first waveguide;
optically coupling the laser signal from the first coupling portion of the first waveguide into a second coupling portion of a second waveguide, wherein the first waveguide is separated from the second waveguide by a semiconductor layer, wherein the first coupling portion at least partially overlies the second coupling portion;
guiding the laser signal by the second waveguide to a tuning portion of the second waveguide; and
tuning the wavelength of the laser signal by the tuning portion of the second waveguide.

15. The tunable laser of claim 5, wherein the first coupling portion at least partially overlies the second coupling portion.

16. The tunable laser of claim 5, further comprising:
a first semiconductor layer forming the first waveguide;
a second semiconductor layer forming the second waveguide; and
wherein the semiconductor layer separating the first waveguide from the second waveguide is a semiconductor substrate layer supporting the first semiconductor layer and the second semiconductor layer.

17. The tunable laser of claim 5, wherein:
the second waveguide has a Y-shaped form comprising a first arm and a second arm; and
wherein the second coupling portion forms at least part of the basis of the Y-shaped second waveguide and the first arm and the second arm form the respective arms of the Y-shaped second waveguide.

* * * * *